United States Patent [19]

Guyot et al.

[11] 4,301,522

[45] Nov. 17, 1981

[54] FORMATION OF SONAR CHANNELS BY CHARGE-COUPLED DEVICES

[75] Inventors: Joël Guyot; Jean-Louis Vernet, both of Paris, France

[73] Assignee: Thomson-CSF, Paris, France

[21] Appl. No.: 59,327

[22] Filed: Jul. 20, 1979

[30] Foreign Application Priority Data

Jul. 25, 1978 [FR] France .............................. 78 21968

[51] Int. Cl.$^3$ .............................................. G01S 3/80
[52] U.S. Cl. .................................... 367/123; 367/905
[58] Field of Search ................ 367/103, 118, 121, 123, 367/135, 905

[56] References Cited

U.S. PATENT DOCUMENTS 4,012,628  3/1977  Gersho ................................. 235/156
4,035,628  7/1977  Lampe et al. ........................ 235/193
4,170,766  10/1979  Pridham et al. ..................... 367/123

FOREIGN PATENT DOCUMENTS 1325414  8/1973  United Kingdom .

*Primary Examiner*—Richard A. Farley
*Attorney, Agent, or Firm*—Cushman, Darby & Cushman

[57] ABSTRACT

Formation of channels for all-round passive sonar systems by the technique of charge-coupled devices. The shift register receives the multiplexed signals of the M transducers forming the listening base of the sonar system. The shift register has different series of sub-contacts, each series corresponding, at one moment, to the signal of one of the transducers. The adding of the weighted signals of one series gives an interpolated signal of the corresponding transducer. The such obtained delayed signals are weighted and added, such obtaining the preformed channels.

7 Claims, 5 Drawing Figures

FIG_1
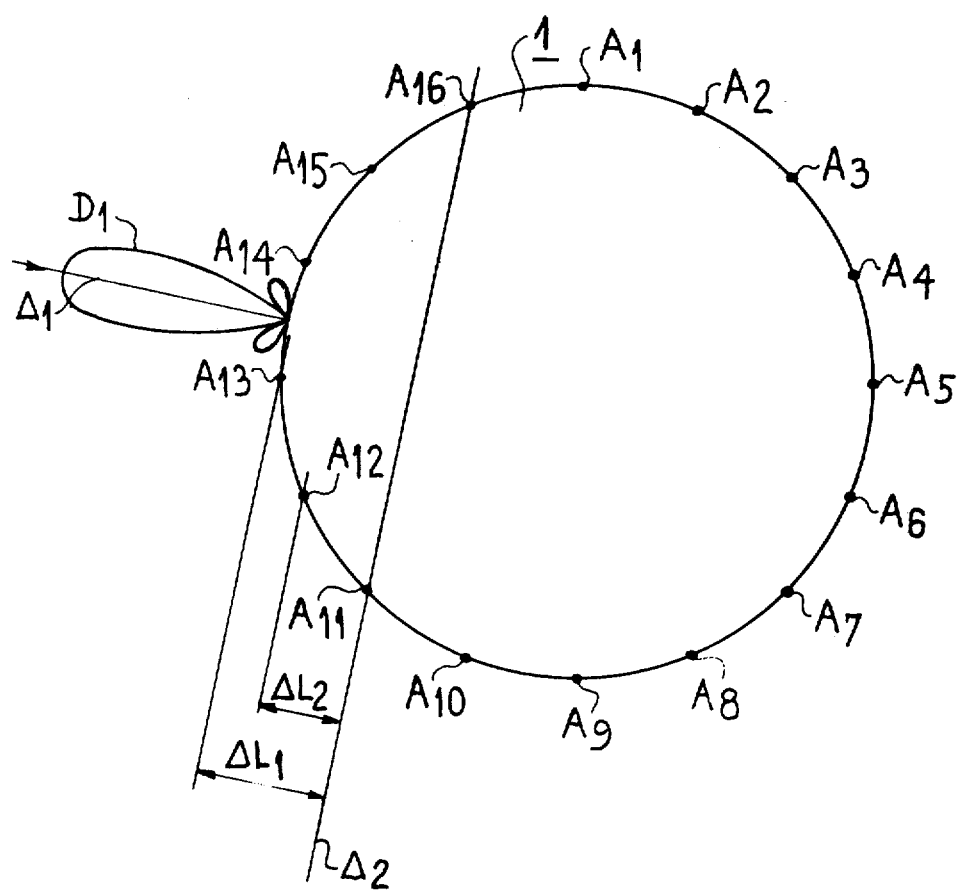

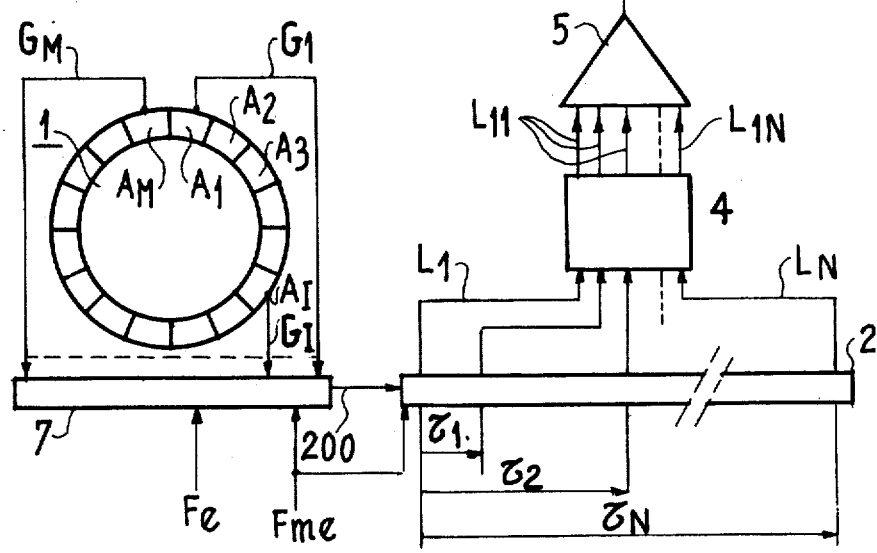
FIG_2
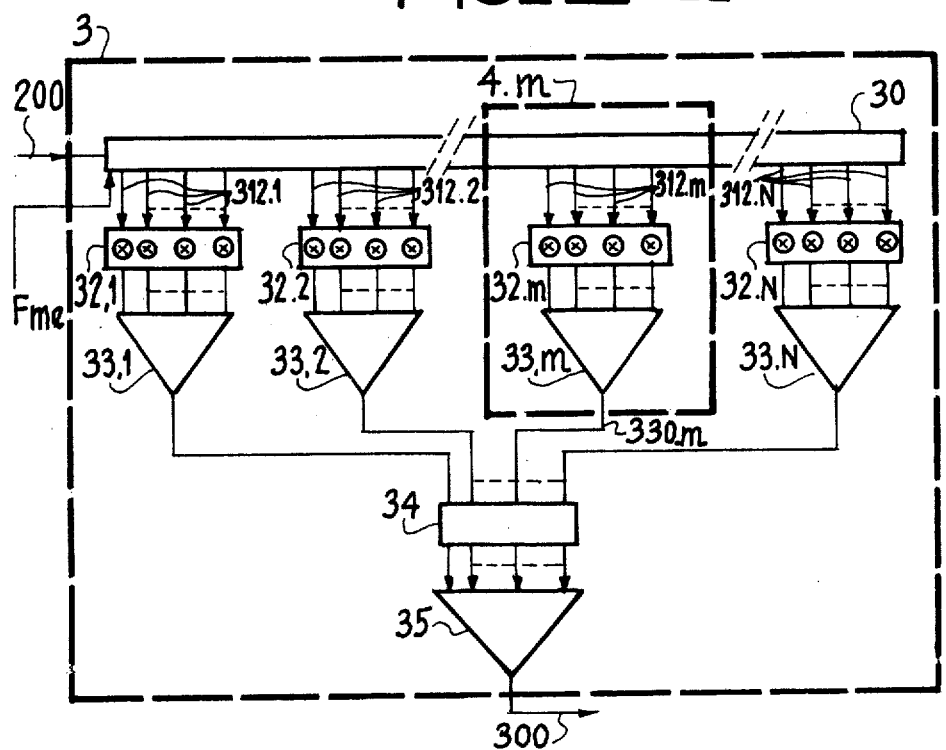
FIG_3-a

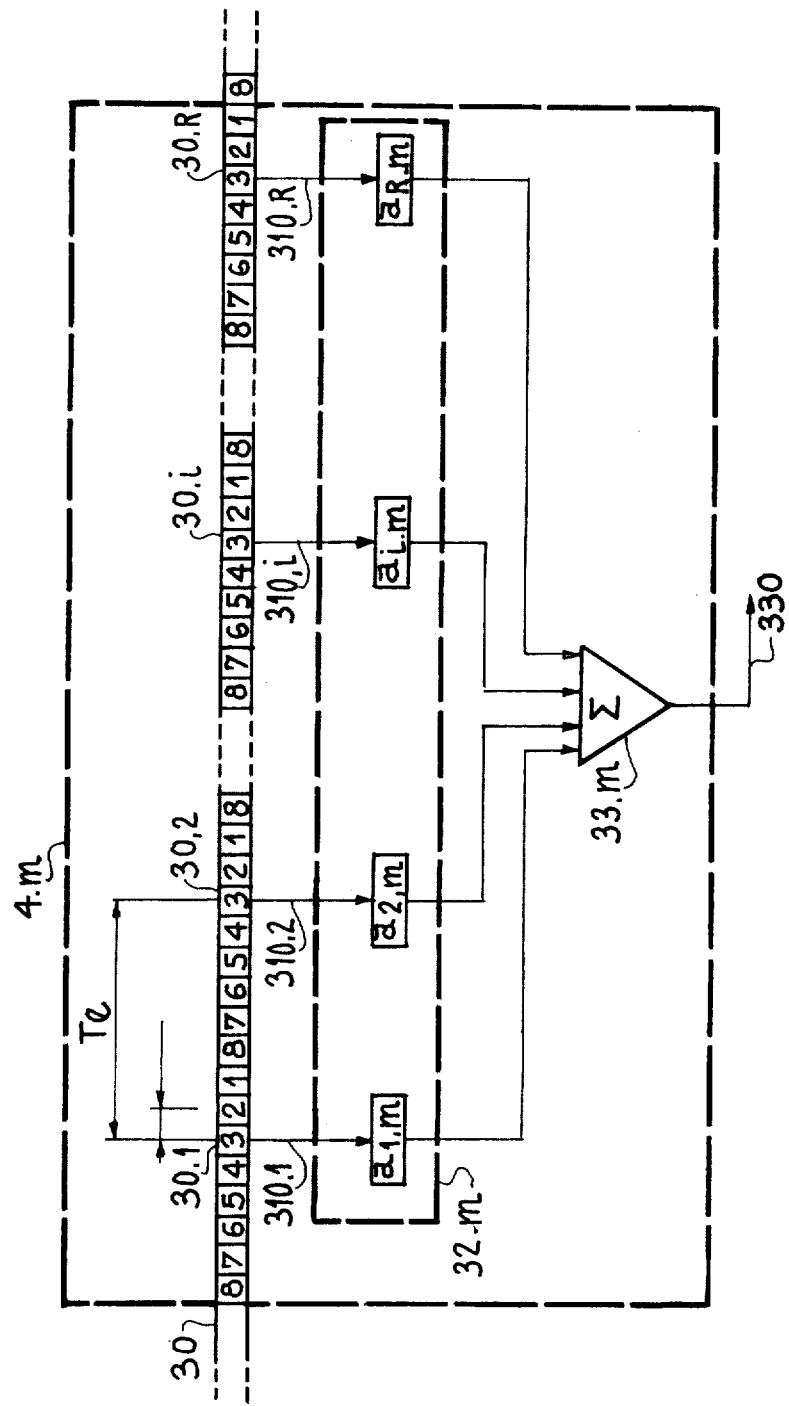

FIG_4
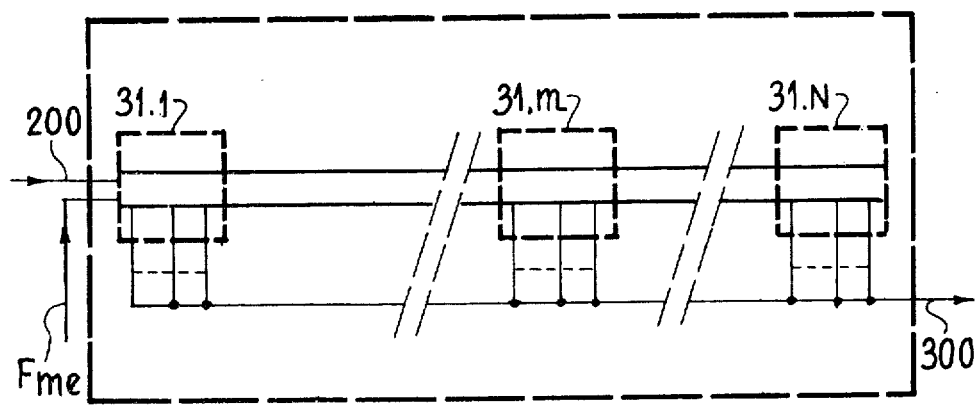

FORMATION OF SONAR CHANNELS BY CHARGE-COUPLED DEVICES

BACKGROUND OF THE INVENTION

This invention relates to the formation of optimised sonar channels, more particularly in an all-round passive sonar system equipped with an advantageously circular listening base. The formation of the channels is obtained by the "charge-coupled device" (CCD) technique.

A preformed channel is used to listen for acoustic noise about a given direction. It is obtained by compensating the relative delays (in relation to this listening direction) of the electrical signals supplied by the transducers forming the listening base. These delays are obtained by delay lines and, in particular, by digital or analog CCD, shift registers.

The advantage of using charge-coupled devices rather than digital devices is attributable to the fact that, where charge-coupled devices are used, the signals are treated in the form of analog samples. As a result, hardware is simplified because, in digital systems, it is necessary to use as many shift registers as there are bits resulting from the quantization of the amplitudes. In addition, the CCD technique eliminates the need for analog-digital and digital-analog converters which are expensive and reduce the signal-to-noise ratio.

In this technique of forming channels by charge-coupled devices, the signals received by the various transducers forming the listening base may be treated in parallel. The disadvantage of this is that it requires as many CCD shift registers as there are transducers. Accordingly, it is of greater advantage to treat these signals in series by multiplexing.

For treating the signals in series according to the prior art, the delays are obtained by contacts on the CCD shift register which receives the multiplexed signals. These contacts supply sampled signals corresponding to different transducers with the delays required for forming the channels. In fact, for conventional bases having diameters of the order of 2 meters for example, these delays cannot be obtained with sufficient precision to enable the resulting channel reception patterns to be used in practice. This is due to the fact that, to obtain high precision, it would be necessary to use CCD shift registers having a number of cells too large (over 500) to be useable in view of the "transfer inefficiency" of charge-coupled devices.

SUMMARY OF THE INVENTION

The arrangement according to the invention uses a series treatment in a CCD shift register in which the signal contact corresponding to the delay to be compensated is replaced by a certain number of sub-contacts.

According to one aspect of the invention, the sub-contacts of the CCD shift register supply weighted values of the successive samples of one and the same transducer. These weighted signals are applied to an adder which supplies the interpolated value of the signal of this transducer for the delay time required for formation of the channels. Weighting is obtained by using for the CCD cell corresponding to the sub-contact, control electrodes divided into two and having surface areas corresponding by a known method to the weighting coefficient.

Accordingly, the arrangement according to the invention obviates the disadvantage of the prior art by enabling suitable reception patterns to be obtained with a CCD having less than 500 cells.

This interpolation is obtained by the method of transversal filtering, so that the arrangement according to the invention will be referred to as an interpolation filter.

According to other aspects of the invention, the interpolation filter may be modified by varying the surface areas of the electrodes enabling the weightings to be obtained in order additionally to obtain so-called optimisation filters, for example a filter for reducing secondary lobes of the pattern and/or a filter for producing a pattern which does not change with the frequency.

Other objects and advantages of the invention will hereinafter appear.

BRIEF DESCRIPTION OF THE DRAWINGS

FIG. 1 shows the principle on which channels for an all-round sonar system are formed.

FIG. 2 is a diagram illustrating the formation of channels by charge-coupled devices.

FIGS. 3a and 3b diagrammatically illustrate interpolation filters according to the invention.

FIG. 4 illustrates a CCD weighting system.

DESCRIPTION OF THE PREFERRED EMBODIMENT

FIG. 1 shows a circular base 1 equipped with M transducers A1, A2 ... AM (in FIG. 1, M=16). To form a channel centred on the direction $\Delta 1$, only the signals received by N transducers are used. For forming the channel shown in the example of FIG. 1, the transducers A11, A12, A13, A14, A15 and A16 (N=6) are used. Thus, for a circular listening base, it is the transducers situated on an arc corresponding to a 135° sector which participate in the formation of a channel. It is necessary to compensate the relative delays for each transducer. The figure shows that the differences in propagation distance $\Delta L_1$ and $\Delta L_2$ for the transducers A12 and A13 in relation to the straight line $\Delta 2$ formed by the transducers A11 and A16 (M even) where $\Delta 2$ is perpendicular to $\Delta 1$. The delay $\tau 1$ for the transducer A12 for example is easily deduced from the relation: $\tau 1 = -\Delta L_1/C$ where C is the speed of the sound in the propagation medium.

To ensure that the reception pattern D1 corresponding to the channel formed does not have any troublesome secondary lobes, it is generally considered that the delays have to be compensated with a precision of the order for example of T/8 where T is the period of the highest frequency of the spectrum of the signals in which the listening watch is being kept. The pattern D1 depends in principle on the frequency f in question in this spectrum.

It is known that, if a function has a spectrum limited by the frequency F, it may be sampled at time intervals of $\frac{1}{2}F$ without any loss of information. This is the Shannon theorem. Thus, if F=8000 Hz, sampling has to take place at time intervals of 62.5$\mu$ sec.

It is known that, in order to obtain suitable patterns in the technique of channel formation, the delays have to be compensated with a precision of $\mp \Delta \tau$ where $\Delta \tau$ is even shorter than T=1/F, for example $\Delta \tau = \frac{1}{8}F$. Accordingly, to form the channels, sampling has to take place at time intervals at least four times shorter than the Shannon criterion.

Thus, where F=8000 Hz, sampling has to take place at time intervals of 15.6μ sec. Sampling such as this correspond to charge-coupled devices having a number of cells too large to be useable in view of their "transfer inefficiency". This is due to the fact that not all the charge q of one cell is transferred to the following cell so that a charge residue q always remains.

In practice ε has the following value: $10^{-3} < \epsilon < 10^{-4}$, so that the total number of cells must not exceed 500.

To form the channels, the M signals, sampled at the frequency $F_e$, of the M transducers are multiplexed. Accordingly, the multiplexing frequency $F_{me}$ is defined as $F_{me} = M F_e$, so that the number of cells P is defined as $$P = \Delta\tau_{max} M F_e \qquad (1)$$

where τmax is the longest delay to be considered.

Thus, for a base having a diameter of 2.50 meters, M=32 and N=12:

$$\Delta\tau_{max} = 496\mu \text{ sec.}$$

Taking the foregoing considerations into account, $F_e \approx 62.5$ kHz which substantially corresponds to eight times the maximum frequency of 8 kHz rather than two times according the Shannon criterion. With these values, relation (1) gives: $P \approx 992$ which is too high in terms of present technology. It can be shown that, generally, this number of cells increases like the square of the maximum frequency and like the square of the diameter of the listening base of the sonar system.

FIG. 2 shows a general plan for the formation of channels corresponding to known techniques. The signals received by the transducers A1, A2, . . . AM of the base 1 are multiplexed at the frequency $F_{me}$. To this end, it is possible with advantage to use CCD technology by simultaneously connecting the transducers A1, A2, . . . AM to cells of the CCD shift register 7 by the connections G1, G2, . . . GI, . . . GM at the rhythm of the sampling frequency $F_e$ and by transferring this information at the rhythm $F_{me}$ to a register 2 having M contacts corresponding to the delays to be introduced for each transducer. These contacts are connected by connections L1, L2, . . . LN to filters 4. The filtered signals are connected by connections L11, L12, . . . L1N to adder 5 at whose output the preformed channels are obtained. The filters 4 enable the secondary lobes to be reduced and/or the patterns to be rendered substantially independent of the signals received.

The arrangement described above cannot be used in practice, on account of the excessive number of CCD cells required.

According to the invention, the number of cells P is reduced in relation to the prior art by selecting a value for $F_e$ of ≈2.5 F and by replacing the single contact for collecting a delayed sample corresponding to one transducer by R sub-contacts for simultaneously collecting R successive samples emanating from one and the same transducer.

FIGS. 3a and 3b diagrammatically illustrate the principle on which optimised channels are formed in accordance with the invention. The multiplexed signal issuing at 200 from the CCD register 7 of FIG. 2 enters the CCD shift register 30 of FIG. 3a at 200. Multiple series contacts 312.1,312.2, . . . 312.m, . . . 312.N are provided for collecting the samples with delays around τ1, τ2 . . . τm . . . τN. There are R sub-contacts in each of the multiple contacts, such as 312.m, which enable the R successive samples of the signals of one and the same transducer to be collected. These signals are weighted at 32.1, 32.2, . . . 32.m . . . 32.N and added in the adders 33.1, 33.2 . . . 33.m, . . . 33.N. After addition, these signals are filtered by the filters 34 and then added by the adder 35. Finally, the sampled signals of the performed channels, which move past by circular permutation, are obtained at 300.

According to the invention, it is possible by using CCD shift registers to obtain the precision required for the compensation delays through the use of a lower sampling frequency and a smaller number of CCD cells than in the prior art.

Samples of the signal of the transducers are available, $e(t)$ being one such signal. From samples $e(q T_e)$, where q is an integer, it is possible to interpolate the value X(t') for a time t' by the following relation:

$$X(t') = \sum_q a_q e(q T_e) \qquad (2)$$

where $a_q$ are weighting constants dependent on q and t', and it will be shown hereinafter how the values of the constants $a_q$ may be determined.

The interpolation filter is shown in detail in the symbolic FIG. 3b. This Figure shows the CCD register 30 and the numbers carried in the cells corresponding to the samples of the signals of the eight transducers (in the interests of simplicity, M=8). The time required to pass from one sample to the following sample corresponding to one and the same transducer is $T_e = 1/F_e$ and the samples advance to the right in the register 30 at the multiplexing rate $T_{me} = 1/F_{me}$.

The total 32.m of the R sub-contacts 310.1, 310.2, . . . 310.i . . . 310.R enables R samples corresponding to one and the same transducer (3 in FIG. 3b) to be collected. The surface areas of the electrodes of the register are such that the samples taken by the sub-contacts 310.1, 310.2 . . . 310.i . . . 310.R are respectively weighted by the positive or negative coefficients $a_{1,m}, a_{2,m}, \ldots a_{i,m}, \ldots a_{R,m}$. The weighted signals are added by the adder 33.m (in reality by the parallel connection of the electrodes) and, at 330, give the corresponding interpolated signal delayed by $\tau_m$.

The operation of an interpolation filter is based on the property known in signal processing as Shannon interpolation. In effect, any sampled signal may be reconstituted from its samples on the basis of Shannon's interpolation relation:

$$X(t) = \sum_{n=-\infty}^{n=+\infty} e(nT_e) \cdot \frac{\sin \frac{\pi}{T_e}(t - nT_e)}{\frac{\pi}{T_e}(t - nT_e)}$$

where n is a positive integer.

Compared with relation (2), it can be seen that it is sufficient to give the coefficient $a_1$ values sampled in the function sin x/x. This function corresponds to the impulse response of a perfect low-pass filter having a cut-off frequency $F_c = F_e/2$.

In reality, this impulse response is obviously limited in terms of time and the reconstitution of X(t) is already at an advanced stage, starting from four samples (the interpolation with two samples corresponding to the linear interpolation which is made when the dots of a graph are joined by straight lines).

Various methods may be used for calculating these R coefficients. The values given in Table 1 below are the result of an optimisation in dependence upon the spectrum of the signal by minimising the value of the mean quadratic deviation of the error when the signal e(t) is a sinusoid having a frequency between O and F. They are established for seven possible intermediate points of the value of $e(nT_e)$ comprised between two consecutive sampling instants $e(n-1)$ $T_e$, $e(nT_e)$, $e(n+1)T_e$, thus restoring the error in the required delay to $T_e/16$.

TABLE 1

$0.00 \times e[(n-1)T_e] + 1.00 \times e[nT_e] + 0.00 \times e[(n+1)T_e] + 0.00 \times e[(n+2)T_e] = e(nT_e)$ $-0.08 \times e[(n-1)T_e] + 0.96 \times e[nT_e] + 0.14 \times e[(n+1)T_e] - 0.05 \times e[(n+2)T_e] = e(nT_e + \frac{1}{8} \times T_e)$ $-0.14 \times e[(n-1)T_e] + 0.88 \times e[nT_e] + 0.30 \times e[(n+1)T_e] - 0.10 \times e[(n+2)T_e] = e\left(nT_e + \frac{2}{8} \times T_e\right)$ $-0.16 \times e[(n-1)T_e] + 0.76 \times e[nT_e] + 0.46 \times e[(n+1)T_e] - 0.14 \times e[(n+2)T_e] = e(nT_e + \frac{3}{8} \times T_e)$ $-0.16 \times e[(n-1)T_e] + 0.62 \times e[nT_e] + 0.62 \times e[(n+1)T_e] - 0.16 \times e[(n+2)T_e] = e\left(nT_e + \frac{4}{8} \times T_e\right)$ $-0.14 \times e[(n-1)T_e] + 0.46 \times e[nT_e] + 0.76 \times e[(n+1)T_e] - 0.16 \times e[(n+2)T_e] = e(nT_e + \frac{5}{8} \times T_e)$ $-0.10 \times e[(n-1)T_e] + 0.30 \times e[nT_e] + 0.88 \times e[(n+1)T_e] - 0.14 \times e[(n+2)T_e] = e\left(nT_e + \frac{6}{8} \times T_e\right)$ $-0.05 \times e[(n-1)T_e] + 0.14 \times e[nT_e] + 0.96 \times e[(n+1)T_e] - 0.08 \times e[(n+2)T_e] = e(nT_e + \frac{7}{8} \times T_e)$ $-0.00 \times e[(n-1)T_e] + 0.00 \times e[nT_e] + 1.00 \times e[(n+1)T_e] - 0.00 \times e[(n+2)T_e] = e[(n+1)T_e]$ It is obvious that this Table is only given as an indication. On the one hand, the calculation may be made with more than four coefficients and, on the other hand, these coefficients may be established for all the time values comprised between the two samples $e(nT_e)$ and $e[(n+1) T_e]$. It will moreover be noted that, as a result of the interpolation, the shift register 30 has to be slightly longer than in an arrangement which does not use the interpolation. This extra length, which is proportional to the number of interpolation coefficients, corresponds to a few additional sampling periods at the beginning and end of the register.

According to the invention, the filter for reducing the secondary lobes is also formed by the CCD technique.

In effect, a structure such as that shown in FIG. 3b also represents a transversal filter. If $e(n-i) T_e$ are the successive samples of a signal emanating from one and the same source at the instant $nT_e$ and delayed by $iT_e$ and if $a_i$ are the weighting coefficients, the result obtained after addition is as follows:

$$s(nT_e) = \sum_{i=0}^{i=R} e[(n-i) T_e] \cdot a_i \quad (3)$$

comparable with:

$$s(t) = \int_{t-\theta}^{t} e(t-\tau) \cdot h(\tau) \cdot d\tau = e(t) * h(t) \quad (4)$$

representing by definition the output signal s(t) of a filter having an impulse response h(t) of finite duration $\theta$ for an input signal e(t), all these time functions being sampled at $nT_e$, and where * is the convolution symbol.

Accordingly, the coefficients $a_i$ are identifiable with the sampled values of the impulse response characterising the filter.

Accordingly, it appears that, depending on the number R of the samples taken and on the algebraic value of the weighting coefficients $a_i$, it is possible with a given approximation to reconstitute this pulse response and, hence, the characteristics of a filter given a priori for optimising the radiation patterns. For example, it is known that, throughout the frequency spectrum of the signals received, it is possible to reduce the secondary lobes of the radiation pattern formed from a circular base.

It has been seen that, to reduce the secondary lobes of the pattern, it is necessary to filter the signals coming from each transducer by different filters 34 shown in FIG. 3a. Now these filters may be formed by CCD technology. The association in series of two filters having respective impulse responses of $h_1(t)$ and $h_2(t)$ gives a resulting filter having an impulse response $h_3(t)$ such that $$h_3(t) = h_1(t) * h_2(t). \quad (5)$$

Accordingly, it is possible according to the invention, using one and the same transversal filter of impulse response $h_3(t)$, to produce the interpolation filter of impulse response $h_1(t)$ and the filter for reducing secondary lobes having an impulse response of $h_2(t)$.

Relation (5) may be expressed in terms of the frequencies. It is known that the filtration functions $A_1(f)$, $A_2(f)$ and $A_3(f)$ are the Fourier transforms of the impulse responses $h_1(t)$, $h_2(t)$ and $h_3(t)$. According to Parseval's theorem, relation (5) may be expressed as follows:

$$A_3(f) = A_1(f) \cdot A_2(f) \quad (5')$$

It should be noted that the interpolation filter shown in FIG. 3b is indeed equivalent to a filtration.

The impulse response $h_3(t)$ is more spread out as a function of time than the longer of the two pulse responses. Accordingly, the samples of this new impulse response will have to be larger in number than those used for a single interpolation. In making the choice, it is necessary to allow for the number of sub-contacts R.

In order to obtain the filter of impulse response $h_3(t)$, it is sufficient to form the surfaces of the electrodes enabling the corresponding weighting coefficients $a_{1,m}$, $a_{2,m}, \ldots a_{i,m}, \ldots a_{R,m}$ (FIG. 3b) to be obtained and to arrange them in parallel for producing the addition.

According to the invention, the band-pass filters required for filtering the transducer signals by a function $A_4(f)$ for obtaining a pattern independent of the frequency may be obtained by weighting the coefficients $a_{1,m}, a_{2,m}, \ldots a_{i,m}, \ldots a_{R,m}$, so as to obtain an impulse response $h_5(t)$ such that $h_5(t) = h_1(t) * h_4(t)$ where $h_4(t)$ is the impulse response of the frequency equalising filter which is the Fourier transform of the filtration function $A_4(f)$.

Finally, it is of advantage to use weighting coefficients giving a filtering function $A_6(f)$ such that the functions of optimising secondary lobes $A_2(f)$ and equalising the patterns in dependence upon the frequency $A_4(f)$ are cumulated with the temporal interpolation function $A_1(f)$.

Finally, FIG. 4 diagrammatically illustrates the CCD according to the invention as a whole. In the interests of simplicity, the electrodes have not been shown in detail. However, the assemblies, such as 31.m, represent the electrodes for intercepting the circulating charges with their respective surfaces representing the coefficients of the various transversal filters.

It can be seen that the CCD, which performs all the functions of interpolating and optimising the radiation patterns formed, is in reality considerably simpler than in the basic diagram shown in FIG. 3a where it is illustrated in its compound functions:

In effect:

a—each of the filters 34, in the form of a transversal filter produced with the charge-coupled devices, has been incorporated in the corresponding interpolation filter, as illustrated;

b—the initial addition of the signals by adders, such as 33.m, is simply obtained by connecting the R electrodes of an interpolator in parallel, the subsequent addition of the signals issuing from the N interpolators themselves also being easily obtained by connecting the outputs of these interpolators in parallel, these two operations thus consisting in connecting all the electrodes (electrodes are not present in all the cells, but only at the extraction points) in parallel.

It has thus been shown to be possible to produce preformed channels of an all-round passive sonar system by the CCD technique using multiple sub-contacts for collecting the weighted signals of successive samples corresponding to one transducer. This technique provides for interpolation and, hence, for effective compensation of the specific delay of the transducer and, in addition, for filtration to reduce secondary lobes and for equalisation of the reception pattern in dependence upon the frequency.

We claim:

1. A devide for forming channels for an all-round sonar system with an optimised reception pattern comprising:

a plurality M of electroacoustic transducers forming a listening base of said sonar;

means for sampling and multiplexing at a frequency $F_e$ the signals received by said M transducers to produce a multiplexed signal;

a charge-coupled device (CCD) shift register having an input coupled to said sampling means for receiving therefrom said multiplexed signal and having N wherein $N<M$, series of outputs, each series having R subcontacts, said R subcontacts furnishing R delayed signals corresponding to one of the transducers;

transversal filter means for weighting and adding said R delayed signals at said R subcontacts for each of said N series to form N signals; and means for filtering and adding said N signals and providing at the output thereof a signal indicative of the formed channel.

2. Device for forming channels as claimed in claim 1, wherein said transversal filter means are weighted to supply interpolation signals of the transducers with the delays $\tau 1, \tau 2, \ldots \tau N$ where $N<M$ corresponding to the formation of the channels with a temporal precision $\Delta \tau < 1/2F_e$, the weighting coefficients characterising these interpolation filters having filtration functions $A_1^{(1)}(f), A_1^{(2)}(f)\ldots A_1^{(m)}(f)\ldots A_1^{(N)}(f)$ and being optimised for the frequency band of the sonar system.

3. A device for forming sonar channels as claimed in claim 1, wherein said transversal filter means has weighting coefficients such that the filtration function of one of the N filters numbered m is $A_3^{(m)}(f)$, with $A_3^{(m)}(f)=A_2^{(m)}(f)\cdot A_1^{(m)}(f)$, where $A_2^{(m)}(f)$ is the filtration function for the transducer m for reducing the secondary lobes and $A_1^{(m)}(f)$ is the filtration function for the interpolation filter numbered m.

4. A device for forming sonar channels as claimed in claim 1, wherein said transversal filter means has weighting coefficients such that the filtration function of the filter numbered m is $A_5^{(m)}(f)$ with $A_5^{(m)}(f)=A_1^{(m)}(f)\cdot A_4^{(m)}(f)$, where $A_4^{(m)}(f)$ is the filtration function for a transducer for keeping the pattern of the sonar system independent of the frequency in the frequency band of the signals and $A_1^{(m)}(f)$ is the filtration function for the interpolation filter numbered m.

5. A device for forming sonar channels as claimed in claim 1, wherein said transversal filter m corresponds to a filtration function $A_6^{(m)}(f)$ such that $A_6^{(m)}(f)=A_1^{(m)}(f)\cdot A_2^{(m)}(f)\cdot A_4^{(m)}(f)$ where $A_1^{(m)}(f)$, $A_2^{(m)}(f)$ and $A_4^{(m)}(f)$ are respectively the filtration functions numbered m for an interpolation filter, a filter for optimising secondary lobes and a filter for equalizing the pattern with respect to frequency.

6. A device for forming sonar channels as claimed in claim 1, wherein said sonar system is of the all-round type, the transducers arranged in a circle being multiplexed by a second charge-coupled device, each transducer being connected to a cell of said second charge-coupled device.

7. A device for forming sonar channels, as claimed in claim 2 wherein said weighting coefficients of the transversal filter means are obtained by varying the surface areas of the electrodes of the charge-coupled device.

* * * * *